United States Patent
Barbe et al.

(10) Patent No.: US 7,510,919 B2
(45) Date of Patent: Mar. 31, 2009

(54) ANCHORING, BY LATERAL OXIDIZING, OF PATTERNS OF A THIN FILM TO PREVENT THE DEWETTING PHENOMENON

(75) Inventors: Jean-Charles Barbe, Grenoble (FR); Maud Vinet, Grenoble (FR); Béatrice Drevet, Grenoble (FR); Carine Jahan, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 233 days.

(21) Appl. No.: 11/178,337

(22) Filed: Jul. 12, 2005

(65) Prior Publication Data

US 2006/0014333 A1    Jan. 19, 2006

(30) Foreign Application Priority Data

Jul. 12, 2004    (FR) .................................. 04 07751

(51) Int. Cl.
*H01L 21/84* (2006.01)
(52) U.S. Cl. .................. 438/164; 438/165; 438/696
(58) Field of Classification Search .............. 438/164, 438/165, 696, 770; 257/E21.7
See application file for complete search history.

(56) References Cited

U.S. PATENT DOCUMENTS

| | | | |
|---|---|---|---|
| 4,753,896 A | 6/1988 | Matloubian | |
| 5,518,949 A | 5/1996 | Chen | |
| 6,025,629 A * | 2/2000 | Ipposhi et al. | 257/347 |
| 6,171,905 B1 * | 1/2001 | Morita et al. | 438/257 |
| 6,248,637 B1 * | 6/2001 | Yu | 438/300 |
| 6,387,741 B1 * | 5/2002 | Kawano | 438/165 |
| 6,482,707 B1 * | 11/2002 | Fischer et al. | 438/303 |
| 6,521,510 B1 * | 2/2003 | Fisher et al. | 438/424 |
| 6,664,165 B2 * | 12/2003 | Koyama | 438/311 |
| 6,784,042 B2 * | 8/2004 | Salvatore | 438/207 |
| 6,818,536 B2 * | 11/2004 | Ipposhi et al. | 438/585 |

(Continued)

FOREIGN PATENT DOCUMENTS

EP    0 334 268 A2    9/1989

(Continued)

OTHER PUBLICATIONS

Fung et al; "Impact of Scaling Silicon Film Thickness and Channel Width on SOI MOSFET with Reoxidized MESA Isolation"; IEEE 1998; XP 000752630; vol. 45; No. 5 pp. 1105-1110; May 1998.

*Primary Examiner*—M. Wilczewski
(74) *Attorney, Agent, or Firm*—Oliff & Berridge, PLC

(57) ABSTRACT

The invention relates to a thin film having a thickness of less than 10 nm, made of oxidizable semi-conductor material and patterned in the form of patterns. To prevent the dewetting phenomenon of said patterns, lateral oxidized zones are arranged at the periphery of each pattern of the thin film so as to form an anchoring.

This anchoring can be achieved by forming an oxide layer over the whole of the thin film and then depositing a nitride layer. Then the nitride and oxide layers and the thin film are patterned and the thin film is laterally oxidized so that each pattern of the thin film comprises, at the periphery thereof, an oxidized zone of predetermined width. The nitride and oxide layers are then removed so as to release the patterns oxidized at their periphery.

14 Claims, 2 Drawing Sheets

U.S. PATENT DOCUMENTS

| | | | |
|---|---|---|---|
| 6,833,589 B2 * | 12/2004 | Matsuhashi et al. | 257/350 |
| 7,112,849 B2 * | 9/2006 | Ahn et al. | 257/347 |
| 7,141,458 B2 * | 11/2006 | Okamura | 438/151 |
| 7,173,302 B2 * | 2/2007 | Brederlow et al. | 257/296 |
| 7,202,123 B1 * | 4/2007 | Pan | 438/197 |
| 2003/0141548 A1 | 7/2003 | Anderson et al. | |
| 2004/0026746 A1 | 2/2004 | Nakazawa et al. | |

FOREIGN PATENT DOCUMENTS

| | | |
|---|---|---|
| WO | WO 2004/038802 A2 | 5/2004 |

* cited by examiner

ANCHORING, BY LATERAL OXIDIZING, OF PATTERNS OF A THIN FILM TO PREVENT THE DEWETTING PHENOMENON

BACKGROUND OF THE INVENTION

The invention relates to production of micro-components comprising patterns formed in a thin film, made of semi-conductor material and having a thickness of less than 10 nm, said patterns being subject to a dewetting phenomenon when a subsequent treatment step is performed at high temperature.

STATE OF THE ART

In many fields of microelectronics, devices produced using the conventional technologies on bulk silicon are being increasingly replaced by devices on Silicon on Insulator (SOI) substrate or on strained SOI substrate. A SOI substrate is formed by a silicon substrate on which an insulating layer, for example made of oxide, is deposited and a thin film of silicon covers the insulating layer. A strained SOI substrate is a SOI substrate on which a strained thin film is deposited. Such SOI substrates enable total insulation of the micro-components designed to be integrated, such as the CMOS circuits, due to the presence of the buried insulator layer arranged on the silicon substrate. They also ensure a reduction of the stray capacitances and of the short channel effects.

However, with the temperatures and times conventionally used in the micro-electronics field, when patterns are created in a silicon thin film having a thickness of less than 10 nm, a dewetting phenomenon in solid phase of the patterns tends to occur at high temperature. This phenomenon is generally observed during the annealing step preceding a growth step by epitaxy, the annealing step being for example performed at 950° C. It can more generally be observed in any step at high temperature during which the top surface of the pattern and the side walls thereof are free.

The patterns formed in a thin film made of silicon and having a very small thickness (less than 10 nm) are in fact intrinsically unstable and they evolve spontaneously towards a form of equilibrium reached by transportation of matter, mainly by surface diffusion, and which, in extreme cases, corresponds to a population of crystals disjointed from one another. The energy of the system formed by this population of crystals is then smaller than that of the initial pattern. This form of equilibrium is therefore detrimental for the subsequent fabrication steps of a micro-component such as a MOS transistor for which the different zones of the transistor to be defined in the thin pattern, for example the source, the drain, the channel . . . , may no longer be interconnected. Such a dewetting phenomenon also occurs for any type of patterned thin film of very small thickness and made of semi-conductor material able to form a stable oxide when thermal oxidizing takes place, such as for example a silicon and germanium compound (SiGe).

As this phenomenon is induced by the high temperature of the micro-component fabrication steps and in particular the annealing step, some people have attempted to perform annealing at a less high temperature. Indeed, for thin film thickness of about 5 nm and for usual annealing times and atmospheres, performing annealing at a temperature lower than 800° C. does in fact make thin films hardly sensitive to dewetting. However, the next steps, for example the cleaning step which requires species desorption or the epitaxy step, do not enable such an annealing temperature to be used, since, to obtain an interface able to ensure a good crystalline quality of the epitaxied material, the annealing temperature must not be less than 800° C.

OBJECT OF THE INVENTION

The object of the invention is to obtain patterns formed in a thin film made of semi-conductor material and having a thickness of less than 10 nm, stable at high temperatures and therefore protected against the dewetting phenomenon occurring when a subsequent treatment step is performed at high temperature.

According to the invention, this object is achieved by the claims and, in particular, by using lateral oxidized zones respectively arranged at the periphery of each pattern to anchor them and prevent the dewetting phenomenon from occurring in a subsequent treatment step at high temperature.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

As represented in FIGS. 1 to 6, a thin film 1 made of oxidizable semi-conductor material, preferably selected from the group consisting of silicon and a compound of silicon and germanium, is patterned or structured in the form of patterns 1a. The thin film has a thickness of less than 10 nm.

Figure 1:
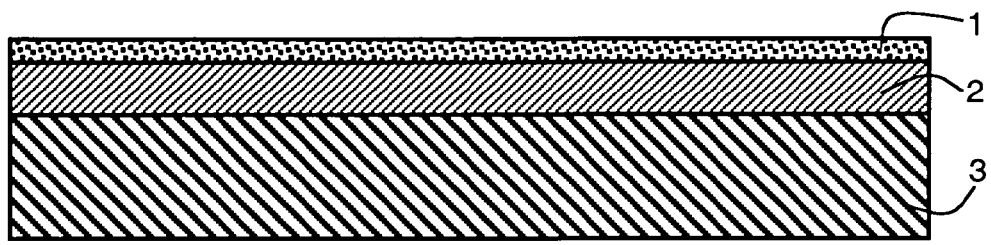
FIGS. 1 to 6 schematically represent, in cross-section, different steps of a particular embodiment of a patterned thin film according to the invention.

Thus, the thin film 1 is preferably previously arranged on the top face of an insulating layer 2 covering a substrate 3 (FIG. 1). In the example described, the substrate 3 is made of silicon and the insulating layer 2 is made of silicon oxide, generally called buried oxide. The assembly constituted by the substrate and insulating layer then forms a SOI substrate.

Figure 2:
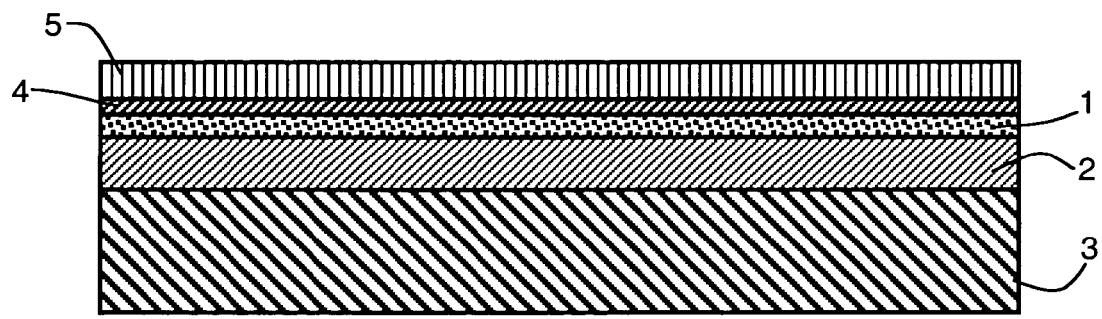

An oxide layer 4, for example made of silicon oxide or formed by a $SiO_2/HfO_2$ bilayer, is then formed on the whole of the free surface of the thin film 1 (FIG. 2). The oxide layer 4, preferably with a thickness of about 2 nm, can be formed by low-pressure chemical vapor deposition also called LPCVD, by plasma enhanced chemical vapor deposition also called PECVD, or by thermal oxidizing of a small thickness of the thin film 1. Then a nitride layer 5, for example of silicon nitride, is deposited on the whole free surface of the oxide layer 4. The nitride layer 5 preferably has a thickness comprised between 10 nm and 20 nm.

Figure 3:
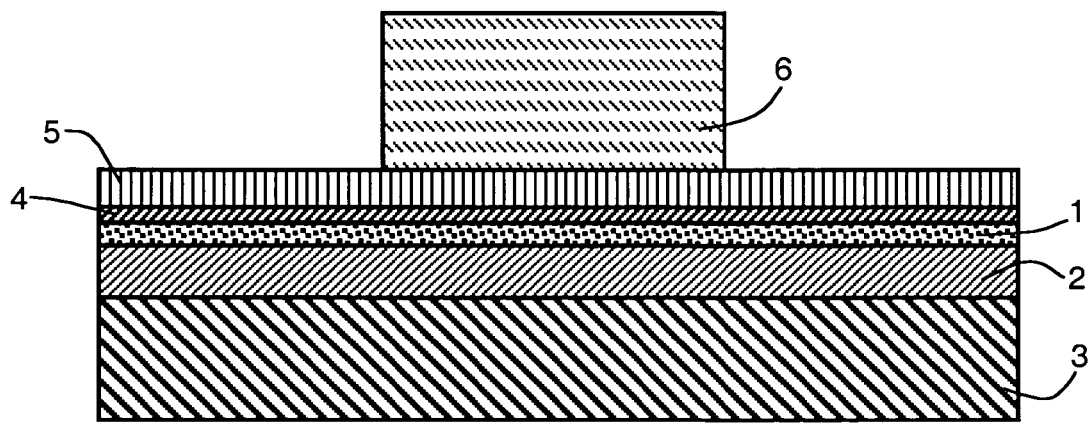
Figure 4:
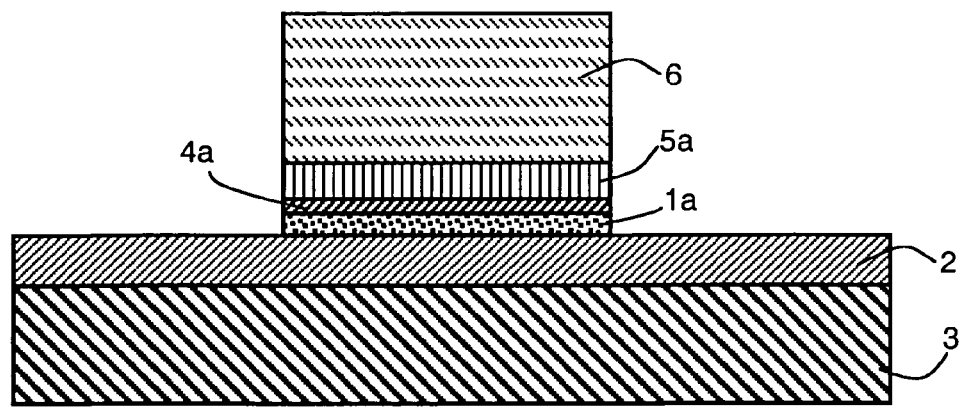

The nitride and oxide layers 5 and 4 and thin film 1 are then patterned or patterned. The patterning can, for example, be stopping at the surface of the insulating layer 2. It is, for example, performed by photolithography or by a method called "e-beam lithography" and which consists in performing lithography by means of an electronic mask then by etching of the nitride and oxide layers and of the thin film. In FIGS. 3 and 4, the nitride and oxide layers 5 and 4 and the thin film 1 are patterned by photolithography by means of a mask 6 made of photosensitive resin. The mask 6 comprises patterns and is arranged at the free surface of the nitride layer 5. The zones of the nitride and oxide layers 5 and 4 and of the thin film 1 not covered by the patterns of the mask 6 are then eliminated. In this way, only the covered zones 5a, 4a and 1a respectively of the nitride layer 5, the oxide layer 4 and the thin film 1 remain on the top surface of the insulating layer 2, which is not patterned. The zones 1a of the thin film covered by the mask 6 then correspond to the patterns of the thin film.

Figure 5:
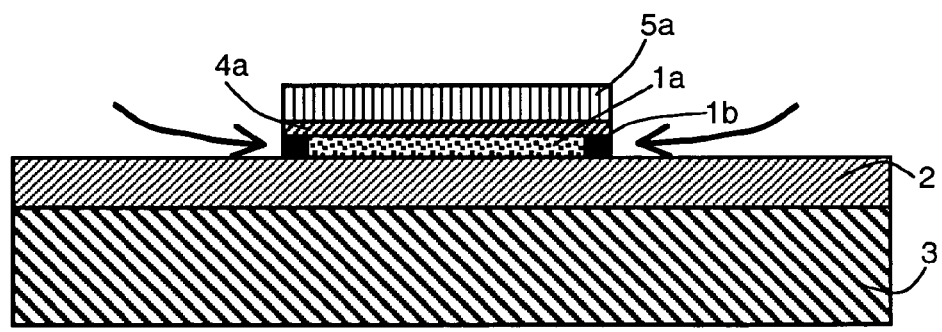
Figure 6:
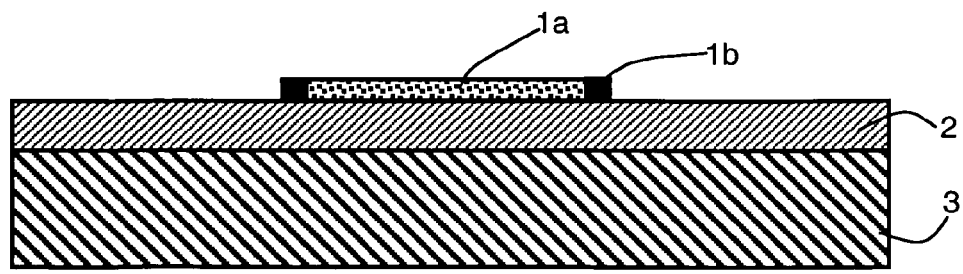

Then, as illustrated in FIGS. 5 and 6, the mask 6 is removed, for example by combination of an oxygen plasma and a chemical solution. The zones 1a of the thin film then undergo lateral oxidizing so that each pattern of the thin film comprises, at the periphery thereof, a lateral oxidized zone 1b of predetermined width. In FIG. 5, lateral oxidizing is illustrated by two arrows arranged laterally on each side of the pattern 1a so as to form the oxidized zone 1b at the periphery of the pattern 1a. Then the nitride layer 5 and the oxide layer 4 are removed so as to release the patterned thin film in the form of oxidized patterns at their periphery. The nitride layer 5 is for example removed by chemical treatment with for example $H_3PO_4$, and if the oxide layer is made of silicon oxide, it can for example be removed by means of a hydrofluoric acid solution.

Each pattern of the thin film of oxidizable semi-conductor material, provided at the periphery thereof with a lateral oxidized zone, thus presents the advantage of being stable at high temperatures and of therefore being protected against the dewetting phenomenon liable to occur during a subsequent treatment step at high temperature such as annealing. The fact that each pattern is oxidized at its periphery, i.e. that it comprises an oxidized peripheral edge, for example an oxidized peripheral ring, in fact enables the patterns to be anchored. Each oxidized peripheral edge in fact delays the dewetting phenomenon of the corresponding pattern as each oxidized peripheral edge is subjected to the dewetting phenomenon before the rest of the non-oxidized pattern and dewetting of an oxidized peripheral edge involves straining of the top surface of the previously flat surface which requires the energy of the system to be increased. In addition, the contact surface between an oxidized peripheral edge and the insulating layers constitutes an anchoring point as it corresponds to a macroscopic roughness that has to be got round for the pattern to be able to sustain the dewetting phenomenon. Furthermore, the presence of the oxide and nitride layers 4 and 5, during the lateral oxidizing step, enables oxidizing of the surface of the thin film 1 to be prevented. It moreover enables the thickness of the oxidized layer 4 and of the oxidized zones 1b to be controlled independently. This makes it possible to ensure that once the oxide and nitride layers 4 and 5 have been removed, each pattern is still oxidized at its periphery.

Furthermore, lateral oxidizing is preferably achieved by thermal oxidizing. Thermal oxidizing is advantageously performed under temperature and partial $O_2$ pressure conditions determined to obtain a sufficiently slow thermal oxidizing rate to control the width of each oxidized zone created.

The width of each oxidized zone is preferably determined according to the method for achieving the oxide used for the oxide layer 4, as the etching rate of an oxide differs depending on the method used for achieving the oxide. More particularly, the width of the oxidized zones is determined by the thickness of the oxide layer 4 formed on the thin film 1 and by the ratio between the respective patterning rates of the oxide layer 4 and of the oxidized zones of the patterns. Thus, an oxide obtained by thermal oxidizing such as that of the oxidized zones of the patterns of the thin film is etched about five times less quickly than an oxide obtained by deposition.

According to the method used to form the oxide layer 4, it is then preferable to determine the width of the zones to be oxidized in the thin film so that the thin film 1, once it has been released, still comprises patterns oxidized at their periphery, i.e. each pattern comprises an oxidized peripheral edge, for example a peripheral ring. Thus, if the oxide of the oxide layer 4 is obtained by thermal oxidizing, lateral oxidizing of the thin film is preferably performed so that the width of the oxidized zones of the film is preferably greater than the thickness of the oxide layer 4, as the oxide layer 4 and the oxidized zones of the thin film have identical etching rates. If the oxide layer 4 is deposited by LPCVD, the width of the oxidized zone can be greater than ⅕th of the thickness of the oxide layer 4, this ratio being determined by the ratio of the respective patterning rates of the oxide layer 4 and of the oxidized zone. The width of the oxidized zones is for example comprised between 10 and 20 nm.

The use of oxide and nitride layers is known as such for achieving oxidized lateral zones. For example, U.S. Pat. No. 5,518,949 describes a lateral electrical insulating method for components achieved on a SOI substrate. This method consists in laterally forming an oxide spacing requiring creation by patterning of a stair in the insulating layer, which may induce technological difficulties during the subsequent fabrication steps. This stair in fact has to be eliminated by a combination of planarization steps of the electric contact levels. Such a method also requires lateral etching of the nitride layer, which makes the process sensitive to charge effects which may then induce dispersions on the electrical characteristics of the devices. Likewise, the Patent Application WO-A-2004/038,802 also describes a fabrication process of a set of transistors and capacitors. Thus, a thin layer made of semi-conductor material and having a thickness of 50 nm is formed on a SOI substrate. Said thin layer is then covered by a layer of silicon oxide and a layer of silicon nitride. Then the layers, respectively of silicon nitride, silicon oxide and a semi-conductor material, are patterned by means of a photosensitive resin mask and by dry etching. A thermal oxidizing step is then performed so as to form substantially rounded oxidized zones on the side walls of the thin layer of semi-conductor material. The oxidized zones are designed to prevent stray channels from subsequently forming on the flanks of the patterns.

Thus, in known manner, formation of a lateral oxidized zone around a pattern is used to electrically insulate said patterns throughout the fabrication process of micro-components, such as transistors and capacitors. However, the object of the invention is not to electrically insulate patterns but to prevent the dewetting phenomenon liable to occur with patterns formed in a thin film of very small thickness (less than 10 nm). This is achieved by creating an anchoring around the pattern, achieved by oxidized peripheral edges or zones. The formation process of this anchoring also enables a patterned thin film in the form of patterns to be obtained, without an oxide spacer. In addition, said process also enables a nitride layer of small thickness to be used, typically 10 nm, which reduces the risk of potential introduction of defects by the nitride.

Thus, according to the invention, the patterns protected against the dewetting phenomenon due to a peripheral oxidized zone can also be used in a micro-component not requiring mesa insulation. Thus, in this case, as the oxidized zones do not play an electrical role, they can be removed as soon as the high temperature treatment steps have been completed.

The invention is not limited to the embodiments described above. Thus, the thin film 1 is not necessarily deposited on a SOI substrate, i.e. on an insulating layer 2 covering a substrate 3. The thin film can be arranged directly on the substrate and, in this case, the patterning step of the nitride and oxide layers and of the thin film stops at the surface of the substrate. The substrate can then be a bulk substrate, for example made of silicon, or it can be made up of a stack of several layers of one or more materials. The substrate can also be, on the surface, of the same nature as the thin film it supports.

Moreover, in the embodiment described in FIGS. 1 to 6, the patterning step of the nitride and oxide layers and of the thin film stops at the surface of the insulating layer 2. Patterning could also extend slightly into the insulating layer 2 or into the substrate 3 if the thin film is arranged directly on said substrate.

The invention claimed is:

1. Process for preventing a dewetting phenomenon of patterns formed in a thin film during a treatment step at high temperature, said process comprising
anchoring said patterns by:
formation of an oxide layer over the whole of the thin film followed by deposition of a nitride layer,
patterning of the nitride and oxide layers and of the thin film so as to form said patterns,
lateral oxidizing of the thin film so that each pattern of the thin film comprises, at the periphery thereof, an oxidized zone of predetermined width,
removal of the nitride and oxide layers so as to release the patterns oxidized at their periphery; the lateral oxidized zone preventing a dewetting phenomenon of the patterns during a subsequent treatment step at high temperature;
wherein the thin film comprises an oxidizable semi-conductor material and has a thickness of less than about 10 nm.

2. Process according to claim 1, wherein the semi-conductor material of the thin film is selected from the group consisting of silicon and a silicon and germanium compound.

3. Process according to claim 1, wherein the thin film is arranged on a substrate.

4. Process according to claim 3, wherein the step of patterning stops at the surface of the substrate.

5. Process according to claim 3, wherein the step of patterning extends into the substrate.

6. Process according to claim 3, wherein an insulating layer is arranged between the substrate and the thin film.

7. Process according to claim 6, wherein the step of patterning stops at the surface of the insulating layer.

8. Process according to claim 6, wherein the step of patterning extends into the insulating layer.

9. Process according to claim 1, wherein the thickness of the oxide layer is about 2 nm.

10. Process according to claim 1, wherein the thickness of the nitride layer is comprised between 10 nm and 20 nm.

11. Process according to claim 1, wherein the lateral oxidizing step is performed by thermal oxidizing.

12. Process according to claim 1, wherein the width of the oxidized zone of the thin film is determined by the thickness of the oxide layer formed on the thin film and by the ratio between the respective patterning rates of the oxide layer and of the oxidized zone.

13. Process according to claim 12, wherein the width of the oxidized zone of the thin film is greater than the thickness of the oxide layer.

14. Process according to claim 12, wherein the width of the oxidized zone of the thin film is comprised between 10 nm and 20 nm.

* * * * *